United States Patent
Bertness

(10) Patent No.: US 6,172,505 B1
(45) Date of Patent: Jan. 9, 2001

(54) ELECTRONIC BATTERY TESTER

(75) Inventor: Kevin I. Bertness, Batavia, IL (US)

(73) Assignee: Midtronics, Inc., Burr Ridge, IL (US)

(*) Notice: Under 35 U.S.C. 154(b), the term of this patent shall be extended for 0 days.

(21) Appl. No.: 09/264,743

(22) Filed: Mar. 9, 1999

Related U.S. Application Data

(60) Provisional application No. 60/083,140, filed on Apr. 27, 1998.

(51) Int. Cl.[7] .................................................. G01N 27/46
(52) U.S. Cl. ........................... 324/430; 324/434; 320/120
(58) Field of Search ........................... 324/430; 340/636; 320/120

(56) References Cited

U.S. PATENT DOCUMENTS

| | | |
|---|---|---|
| 2,514,745 | 7/1950 | Dalzell . |
| 3,356,936 | 12/1967 | Smith . |
| 3,593,099 | 7/1971 | Scholl . |
| 3,607,673 | 9/1971 | Seyl . |
| 3,676,770 | 7/1972 | Sharaf et al. . |
| 3,729,989 | 5/1973 | Little . |
| 3,753,094 | 8/1973 | Furuishi et al. . |
| 3,808,522 | 4/1974 | Sharaf . |
| 3,811,089 | 5/1974 | Strezelewicz . |
| 3,873,911 | 3/1975 | Champlin . |
| 3,886,443 | 5/1975 | Miyakawa et al. . |
| 3,889,248 | 6/1975 | Ritter . |
| 3,906,329 | 9/1975 | Bader . |
| 3,909,708 | 9/1975 | Champlin . |

(List continued on next page.)

FOREIGN PATENT DOCUMENTS

| | | |
|---|---|---|
| 0 022 450 A1 | 1/1981 | (EP) . |
| 29 26 716 B1 | 1/1981 | (DE) . |
| 0 637 754 A1 | 2/1995 | (EP) . |
| 0 772 056 A1 | 5/1997 | (EP) . |
| 2029586 | * 3/1980 | (GB) ................................. 324/430 |
| 2 088 159 | 6/1982 | (GB) . |
| 59-17892 | 1/1984 | (JP) . |
| 59-17893 | 1/1984 | (JP) . |
| 59-17894 | 1/1984 | (JP) . |
| 59017894 | 1/1984 | (JP) . |
| 60225078 | 11/1985 | (JP) . |
| 03274479 | 12/1991 | (JP) . |
| 03282276 | 12/1991 | (JP) . |
| 04131779 | 5/1992 | (JP) . |
| 04372536 | 12/1992 | (JP) . |
| 5216550 | 8/1993 | (JP) . |
| WO 93/22666 | 11/1993 | (WO) . |
| WO 98/58270 | 12/1998 | (WO) . |

OTHER PUBLICATIONS

"Electrochemical Impedance Spectroscopy in Battery Development and Testing", *Batteries International*, Apr. 1997, pp. 59 and 62–63.

(List continued on next page.)

* cited by examiner

Primary Examiner—Safet Metjahic
Assistant Examiner—Joe M. Solis
(74) Attorney, Agent, or Firm—Westman, Champlin & Kelly, P.A.

(57) ABSTRACT

An apparatus for electronically testing or monitoring the condition of a storage battery is provided. The apparatus includes an inductance cancellation circuit for use in a Kelvin probe of an electronic battery tester. The induction cancellation circuit reduces inductive coupling between leads of the Kelvin probe. The apparatus also includes a DC coupled AC amplifier for amplifying an AC response signal of an electronic battery tester. Other aspects include a critically damped band-pass filter a response signal, a DC to DC convertor isolation circuit, operator editable test criteria, a battery temperature sensing element, an automatically adjustable gain stage and the use of an internal reference standard for a self calibration.

42 Claims, 8 Drawing Sheets

U.S. PATENT DOCUMENTS

| | | |
|---|---|---|
| 3,936,744 | 2/1976 | Perlmutter . |
| 3,946,299 | 3/1976 | Christianson et al. . |
| 3,947,757 | 3/1976 | Grube et al. . |
| 3,969,667 | 7/1976 | McWilliams . |
| 3,979,664 | 9/1976 | Harris . |
| 3,984,762 | 10/1976 | Dowgiallo, Jr. . |
| 3,984,768 | 10/1976 | Staples . |
| 4,008,619 | 2/1977 | Alcaide et al. . |
| 4,053,824 | 10/1977 | Dupuis et al. . |
| 4,070,624 | 1/1978 | Taylor . |
| 4,086,531 | 4/1978 | Bernier . |
| 4,112,351 | 9/1978 | Back et al. . |
| 4,114,083 | 9/1978 | Benham et al. . |
| 4,126,874 | 11/1978 | Suzuki et al. . |
| 4,178,546 | 12/1979 | Hulls et al. . |
| 4,193,025 | 3/1980 | Frailing et al. . |
| 4,207,611 | 6/1980 | Gordon . |
| 4,315,204 | 2/1982 | Sievers et al. . |
| 4,316,185 | 2/1982 | Watrous et al. . |
| 4,322,685 | 3/1982 | Frailing et al. . |
| 4,363,407 | 12/1982 | Barkler et al. . |
| 4,369,407 | 1/1983 | Korbell . |
| 4,390,828 | 6/1983 | Converse et al. . |
| 4,392,101 | 7/1983 | Saar et al. . |
| 4,396,880 | 8/1983 | Windebank . |
| 4,408,157 | 10/1983 | Beaubien . |
| 4,412,169 | 10/1983 | Dell'Orto . |
| 4,423,378 | 12/1983 | Marino et al. . |
| 4,423,379 | 12/1983 | Jacobs et al. . |
| 4,424,491 | 1/1984 | Bobbett et al. . |
| 4,459,548 | 7/1984 | Lentz et al. . |
| 4,514,694 | 4/1985 | Finger . |
| 4,520,353 | 5/1985 | McAuliffe . |
| 4,667,279 | 5/1987 | Maier . |
| 4,678,998 | 7/1987 | Muramatsu . |
| 4,679,000 | 7/1987 | Clark . |
| 4,697,134 | 9/1987 | Burkum et al. . |
| 4,707,795 | 11/1987 | Alber et al. . |
| 4,709,202 | 11/1987 | Koenck et al. . |
| 4,710,861 | 12/1987 | Kanner . |
| 4,719,428 | 1/1988 | Liebermann . |
| 4,743,855 | 5/1988 | Randin et al. . |
| 4,816,768 | 3/1989 | Champlin . |
| 4,820,966 | 4/1989 | Fridman . |
| 4,825,170 | 4/1989 | Champlin . |
| 4,849,700 | 7/1989 | Morioka et al. . |
| 4,881,038 | 11/1989 | Champlin . |
| 4,912,416 | 3/1990 | Champlin . |
| 4,929,931 | 5/1990 | McCuen . |
| 4,931,738 | 6/1990 | MacIntyre et al. . |
| 4,947,124 | 8/1990 | Hauser . |
| 4,956,597 | 9/1990 | Heavvvvey et al. . |
| 4,968,941 | 11/1990 | Rogers . |
| 5,004,979 | 4/1991 | Marino et al. . |
| 5,032,825 | 7/1991 | Xuznicki . |
| 5,047,722 | 9/1991 | Wurst et al. . |
| 5,087,881 | 2/1992 | Peacock . |
| 5,126,675 | 6/1992 | Yang . |
| 5,140,269 | 8/1992 | Champlin . |
| 5,144,248 | 9/1992 | Alexandres et al. . |
| 5,170,124 | 12/1992 | Blair et al. . |
| 5,204,611 | 4/1993 | Nor et al. . |
| 5,214,370 | 5/1993 | Harm et al. . |
| 5,214,385 | 5/1993 | Gabriel et al. . |
| 5,241,275 | 8/1993 | Fang . |
| 5,254,952 | 10/1993 | Salley et al. . |
| 5,281,919 | 1/1994 | Palanisamy . |
| 5,281,920 | 1/1994 | Wurst . |
| 5,295,078 | 3/1994 | Stich et al. . |
| 5,298,797 | 3/1994 | Redl . |
| 5,300,874 | 4/1994 | Shimamoto et al. . |
| 5,302,902 | 4/1994 | Groehl . |
| 5,331,268 | 7/1994 | Patino et al. . |
| 5,336,993 | 8/1994 | Thomas et al. . |
| 5,343,380 | 8/1994 | Champlin . |
| 5,352,968 | 10/1994 | Reni et al. . |
| 5,365,160 | 11/1994 | Leppo et al. . |
| 5,365,453 | 11/1994 | Startup et al. . |
| 5,381,096 | 1/1995 | Hirzel . |
| 5,426,371 | 6/1995 | Salley et al. . |
| 5,432,426 | 7/1995 | Yoshida . |
| 5,434,495 | 7/1995 | Toko . |
| 5,442,274 | 8/1995 | Tamai . |
| 5,449,996 | 9/1995 | Matsumoto et al. . |
| 5,449,997 | 9/1995 | Gilmore et al. . |
| 5,457,377 | 10/1995 | Jonsson . |
| 5,485,090 | 1/1996 | Stephens . |
| 5,488,300 | 1/1996 | Jamieson . |
| 5,519,383 | 5/1996 | De La Rosa . |
| 5,528,148 | 6/1996 | Rogers . |
| 5,550,485 | 8/1996 | Falk . |
| 5,561,380 | 10/1996 | Sway-Tin et al. . |
| 5,562,501 | 10/1996 | Kinoshita et al. . |
| 5,572,136 | 11/1996 | Champlin . |
| 5,574,355 | 11/1996 | McShane . |
| 5,585,728 | 12/1996 | Champlin . |
| 5,592,093 | 1/1997 | Klingbiel . |
| 5,596,260 | 1/1997 | Moravec et al. . |
| 5,598,098 | 1/1997 | Champlin . |
| 5,602,462 | 2/1997 | Stich et al. . |
| 5,606,242 | 2/1997 | Hull et al. . |
| 5,607,673 | 3/1997 | Bashengezi . |
| 5,621,298 | 4/1997 | Harvey . |
| 5,642,031 | 6/1997 | Brotto . |
| 5,650,937 | 7/1997 | Bounaga . |
| 5,652,501 | 7/1997 | McClure et al. . |
| 5,675,234 | 10/1997 | Greene . |
| 5,677,077 | 10/1997 | Faulk . |
| 5,699,050 | 12/1997 | Kanazawa . |
| 5,701,089 | 12/1997 | Perkins . |
| 5,717,336 | 2/1998 | Basell et al. . |
| 5,757,192 | 5/1998 | McShane et al. . |
| 5,773,978 | 6/1998 | Becker . |
| 5,789,899 | 8/1998 | van Phuoc et al. . |
| 5,793,359 | 8/1998 | Ushikubo . |
| 5,821,756 | 10/1998 | McShane et al. . |
| 5,821,757 * | 10/1998 | Alvarez ................................ 324/434 |
| 5,831,435 | 11/1998 | Troy . |
| 5,872,443 | 2/1999 | Williamson . |
| 5,914,605 | 6/1999 | Bertness . |
| 5,945,829 | 8/1999 | Bertness . |

OTHER PUBLICATIONS

"Battery Impedance", by E. Willihnganz et al., *Electrical Engineering*, Sep. 1959, pp. 922–925.

"Determining The End of Battery Life", by S. DeBardelaben, *IEEE*, Jan. 1986, pp. 365–368.

"A Look at the Impedance of a Cell", by S. Debardelaben, *IEEE*, Jan. 1988, pp. 394–397.

"The Impedance of Electrical Storage Cells", by N.A. Hampson et al., *Journal of Applied Electrochemistry*, Jan. 1980, pp. 3–11.

"A Package for Impedance/Admittance Data Analysis", by B. Boukamp, *Solid State Ionics*, Jan. 1986, pp. 136–140.

"Precision of Impedance Spectroscopy Estimates of Bulk, Reaction Rate, and Diffusion Parameters", by J. Macdonald et al., *J. Electroanal, Chem.* Jan. 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987.

"Field and Laboratory Studies to Access the State of Health of Valve–Regulated Lead Acid Batteries: Part I Conductance/Capacity Correlation Studies", by D. Feder et al., *IEEE*, Aug. 1992, pp. 218–233.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

ELECTRONIC BATTERY TESTER

The present invention claims priority to Provisional Application Ser. No. 60/083,140, filed Apr. 27, 1998 and entitled BATTERY TESTER.

BACKGROUND OF THE INVENTION

The present invention relates to testing of storage batteries. More specifically, the present invention relates to electronic battery testers used to test storage batteries.

Storage batteries, such as lead acid storage batteries of the type used in the automotive or power standby industries, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin and Midtronics, Inc. of Burr Ridge, Ill. for testing storage batteries by measuring the conductance of the batteries. Aspects of this technique are described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; and U.S. Pat. No. 5,831,435, issued Nov. 3, 1998, entitled BATTERY TESTER FOR JIS STANDARD.

SUMMARY OF THE INVENTION

The present invention includes apparatuses and methods for electronically testing or monitoring the condition of a storage battery. One aspect of the invention includes an inductance cancellation circuit for use in a Kelvin probe of an electronic battery tester. The induction cancellation circuit reduces inductive coupling between leads of the Kelvin probe. Another aspect of the invention includes a DC coupled AC amplifier for amplifying an AC response signal of an electronic battery tester. Other aspects include a critically damped band-pass filter, a DC to DC convertor isolation circuit, operator editable test criteria, a battery temperature sensing element, an automatically adjustable gain stage and the use of an internal reference standard for a self calibration.

DETAILED DESCRIPTION OF THE PREFERRED EMBODIMENTS

There is an ongoing need for improved testing of storage batteries. The present invention includes a battery tester in which current is either injected into or drawn from (i.e., a current sink) the battery. The current is alternately engaged and disengaged at a desired AC frequency. The invention provides a number of advantages over the use of a large resistive load including:

Immunity from contact resistance variations.

High compliance—the ability to test batteries from 1 to 6 cells with a single circuit without possibility of damaging the circuit.

Fixed and/or predictable current coupling effects in the sensing lead wires used to couple to the battery.

Given the function G (conductance)=I/E, a substantially constant current implies substantially constant I. Therefore, only the value of E needs to be measured and a simple inversion results in a quantity directly proportional to G.

Reduced requirements for electrically fusing the device.

Figure 1:
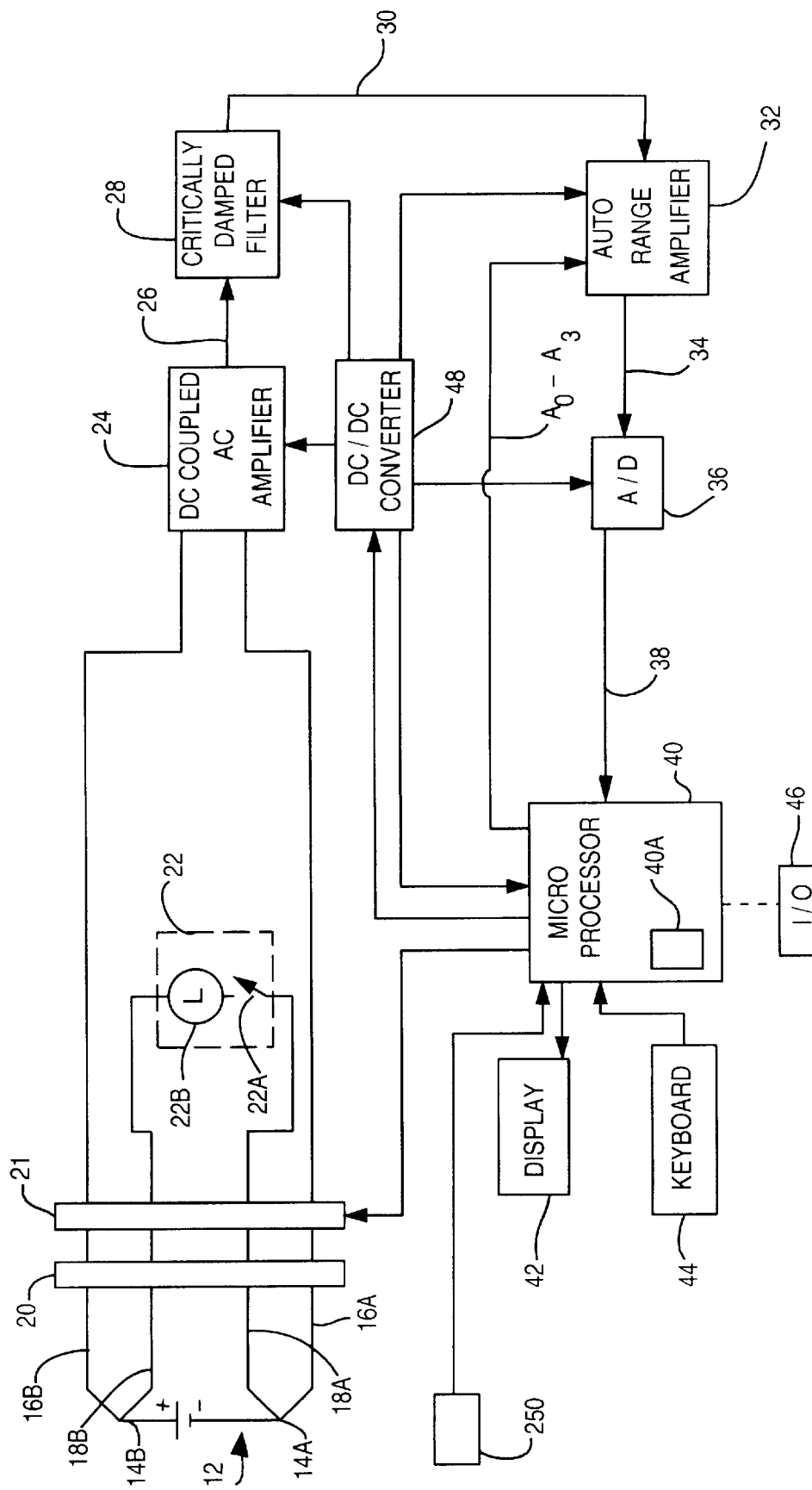
FIG. 1 is a simplified block diagram showing a battery test device in accordance with aspects of the present invention.

FIG. 1 is a simplified block diagram of a battery test device 10 which is one embodiment of an apparatus for monitoring the condition of a storage battery 12 in accordance with aspects of the present invention. Battery test device 10 couples to terminals 14A and 14B of battery 12 using a four point Kelvin connection formed with cables 16A, 16B, 18A and 18B through an inductance cancellation cable 20 and a self calibration circuit 21. A switched current source 22 comprising a switch 22A and a current source 22B is provided and is coupled in series with cables 18A and 18B. In one embodiment, switch 22A operates at between about 5 Hz and about 500 Hz. Cables 16A and 16B are connected to a high impedance DC coupled AC amplifier 24 in accordance with one aspect of the invention. DC coupled AC amplifier provides an amplified output 26 to a critically damped filter 28 in accordance with another aspect of the invention which provides a filtered output 30 to an auto range amplifier 32 in accordance with another aspect. An output 34 from auto range amplifier 32 is provided to analog to digital convertor 36 which in turn provides an output 38 to microprocessor 40. Microprocessor is coupled to a display output 42 and a keypad, keyboard or other use input 44. Optionally, other types of inputs and outputs illustrated as I/O 46, can be coupled to microprocessor 40. For example, microprocessor 40 can couple to an external printer, data communications device such as a modem, or an external storage device. I/O 46 may be coupled using physical cabling or through non-physical links such as infrared, ultrasonic or radio frequency. Battery test device 10 is powered by DC to DC convertor 48 in accordance with another aspect of the present invention.

Figure 2:
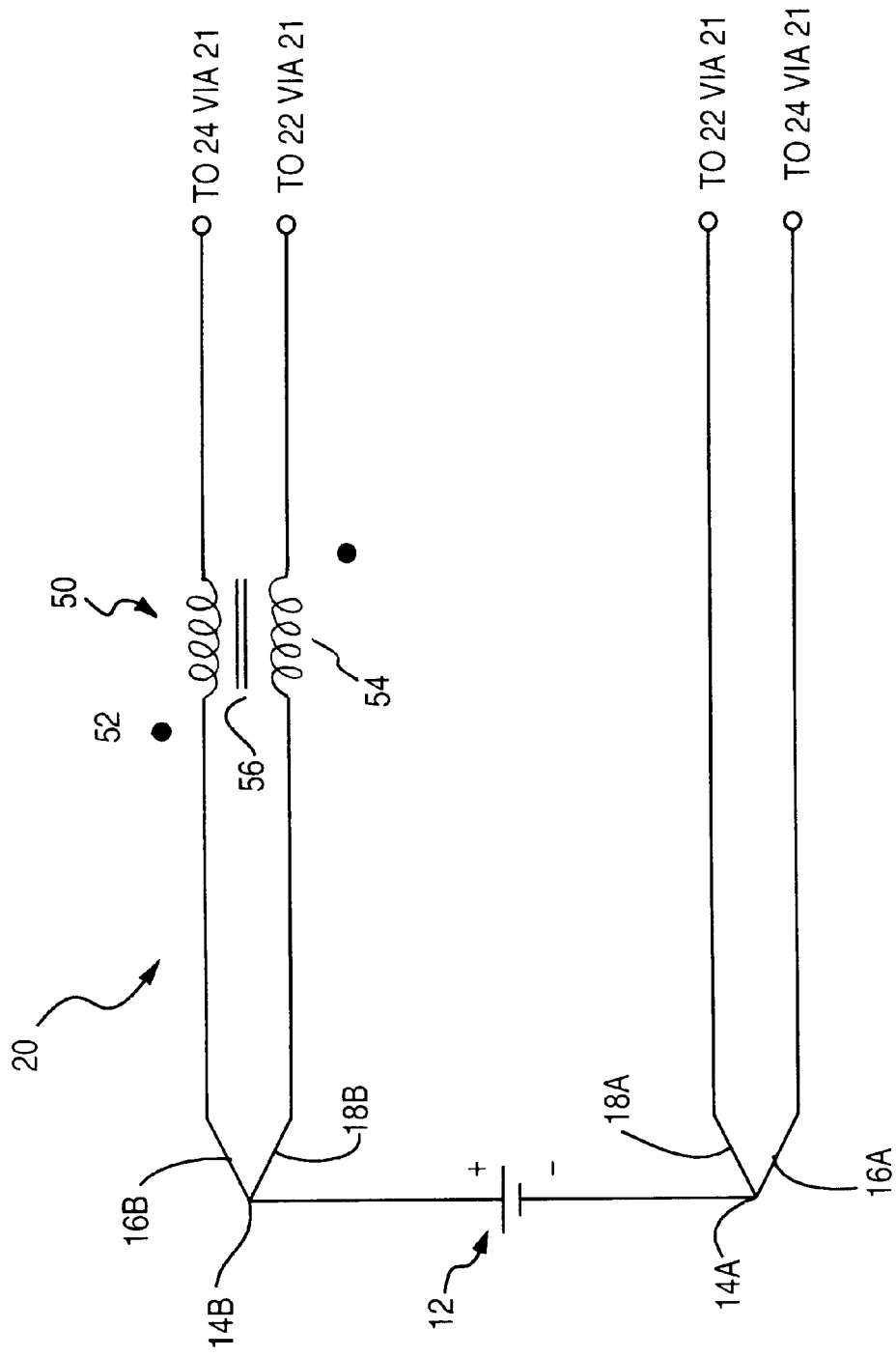
FIG. 2 is a schematic diagram showing an inductance canceling circuit for use with Kelvin probes in accordance with the invention.

FIG. 2 is a simplified schematic diagram of inductance cancellation cable 20 which couples battery 12 to current source 22 and DC coupled AC amplifier 24 through a Kelvin connection. One problem with prior art battery testers has been the mutual inductance due to the Kelvin connections used to couple to the battery. This has lead to the inductive coupling of the current in the sense leads due to their proximity. However, with the present invention a transformer coupling arrangement, as shown in FIG. 2, is provided which effectively "nulls out" the undesirable cross coupling. This allows the present invention to be used with multiple, interchangeable cables, even on large capacity batteries. Transformer 50 is connected with coils 52 and 54 in series with Kelvin leads 16B and 18B, respectively. Coils 52 and 54 are wound in opposite directions on an iron core 56.

In operation, the current in leads 18B and 18A from current source 22 is inductively coupled into leads 16B and 16A. In prior art battery testers, this can be a source of measurement errors. However, transformer 50 causes an opposed cancellation current to be coupled into leads 16B and 16A. The coupling between 52 and 54 can be controlled by adjusting the position of core 56. Such "tuning" can be performed during manufacture. Further, the cables 16A, 16B, 18A and 18B can be removably coupled to battery testing device 10 such that if the cables are damaged or are otherwise desired to be replaced, a new cable pair can be attached. The new cable pair includes its own transformer 50 and has been "tuned" by adjusting core 56 during manufacture such that the noise current is effectively nulled out. Note that in less critical applications, a fixed transformer can be used and the transformer coupling does not require tuning. Further, the use of inductance canceling cable 20 allows the cable to be of relatively long lengths without suffering from excessive inductive coupling between the cables. For example, the battery testing circuitry can be a distance away from the battery, such as held by an operator at a test stand or while sitting inside an automobile, while performing a battery test. Long or short cables or other cabling configurations can be easily exchanged by simply disconnecting a cable pair from the test device 10 and reconnecting a desired pair. As the cable has been previously tuned for appropriate cancellation, the operator does not need to perform any further adjustments in the field. The transformer shown in FIG. 2 is simply one implementation of this concept and other techniques for introducing a cancellation signal such as through active devices or other coupling techniques is considered within the scope of the present invention.

Figure 3:
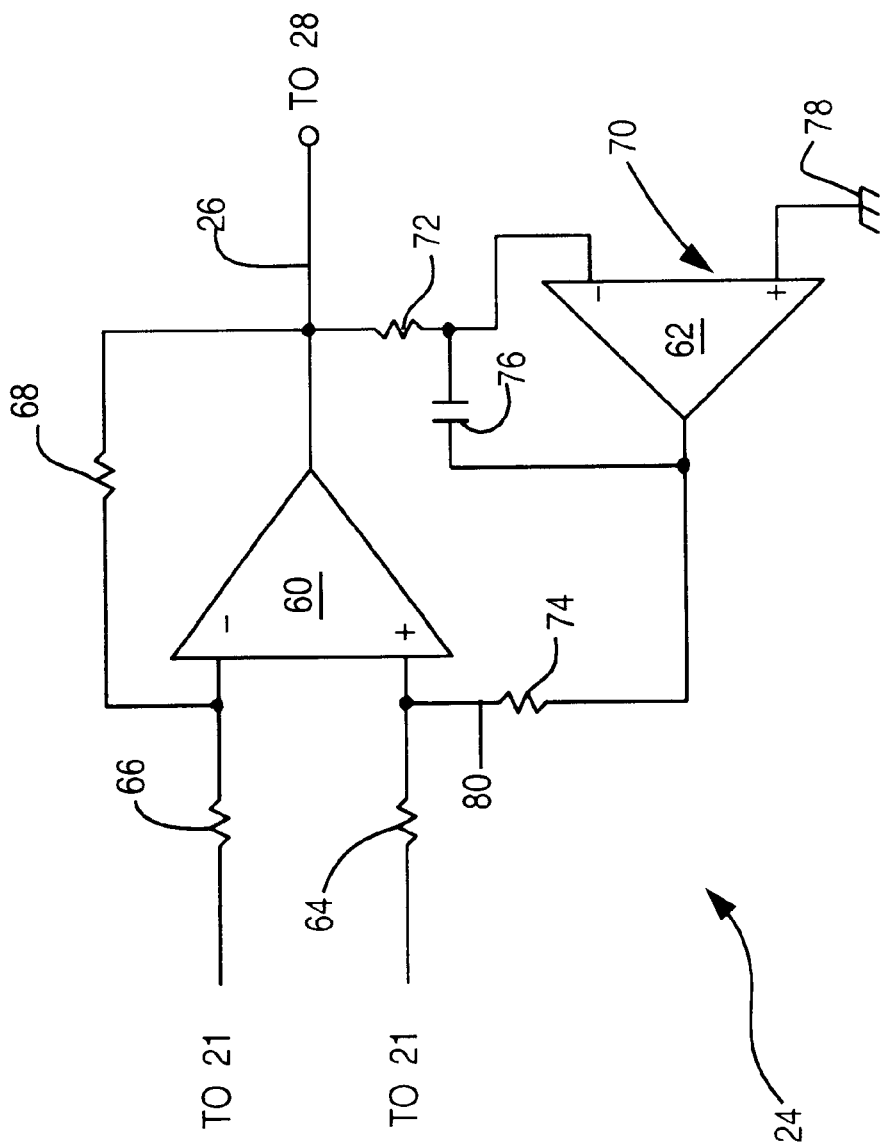
FIG. 3 is a simplified schematic diagram of a DC coupled AC amplifier of FIG. 1.

FIG. 3 is a simplified diagram of DC coupled AC amplifier 24 in accordance with another aspect of the present invention. DC coupled AC amplifier 24 includes differential amplifier 60 and differential amplifier 62. In the embodiments shown, the non-inverting input of amplifier 60 is connected to cable 16A shown in FIG. 1 through a resistor 64 and the inverting input to amplifier 60 couples to cable 16B through coil 52 as illustrated in FIG. 2 and further through resistor 66. The output of amplifier 60 is connected to the inverting input of amplifier 60 through resistor 68 to provide negative feedback. Further, the output of amplifier 60 is coupled to the non-inverting input of amplifier 60 through integrator 70 and resistors 72 and 74. Invertor 70 is formed through differential amplifier 62 having negative feedback from its output to its inverting input through capacitor 76. The non-inverting input of differential amplifier 62 is coupled to electrical ground 78. In one preferred embodiment, the DC coupled AC amplifier 24 has a unity gain.

In the prior art, AC coupled amplifiers have been used in battery testers. However, such amplifiers induce common mode errors, as well as variability in impedance due to changes in, for example, capacitors used to couple to the sense signal. In addition, the coupling capacitors must be relatively large to avoid distortion in the input sense signal. Such capacitors have the negative effect of reducing the settling time necessary to obtain an accurate measurement. However, AC coupling has been used in prior art battery testers to avoid multiplying the DC voltage of the battery by the corresponding high gain of the amplifier. The use of a DC coupled AC amplifier overcomes these problems and does not require large coupling capacitors.

In the particular embodiment shown, DC coupled AC amplifier 24 receives a DC error signal 80 representative of the DC signal present on the output of amplifier 60. The DC error signal 80 is generated by integrator 70 which has a time constant determined by capacitor 76 selected for the particular application based upon the frequency of operation of switch 22A used in switched current source 22. Thus, the output 26 of DC coupled AC amplifier 24 is a purely AC signal generated in response to application of the switched current source 22. The implementation illustrated in FIG. 3 is merely one example which shows the preferred embodiment of a DC coupled amplifier in accordance with the present invention. However, the present invention includes any coupling technique for use in sensing an AC signal from a battery under test which does not require a large AC coupling capacitor to block the DC voltage from the battery.

Figure 4A:
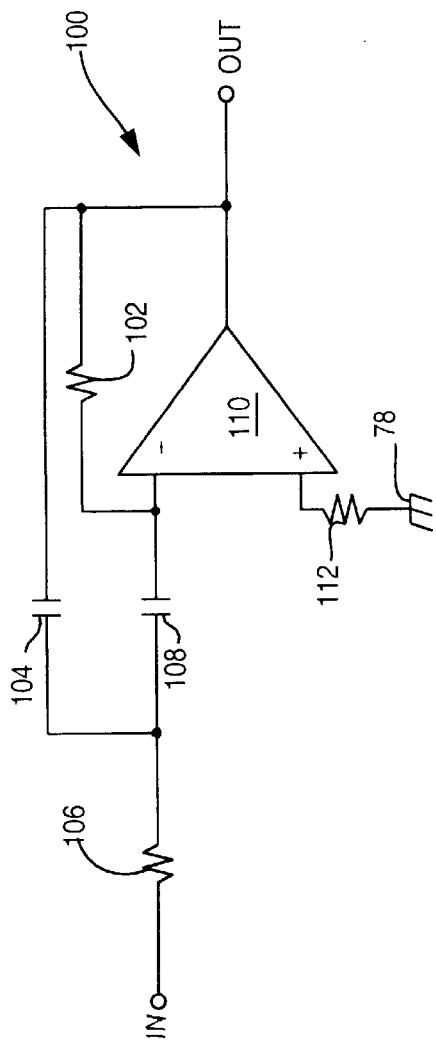
FIG. 4A is a simplified schematic diagram of one stage of a critically damped filter of FIG. 1.
Figure 4B:
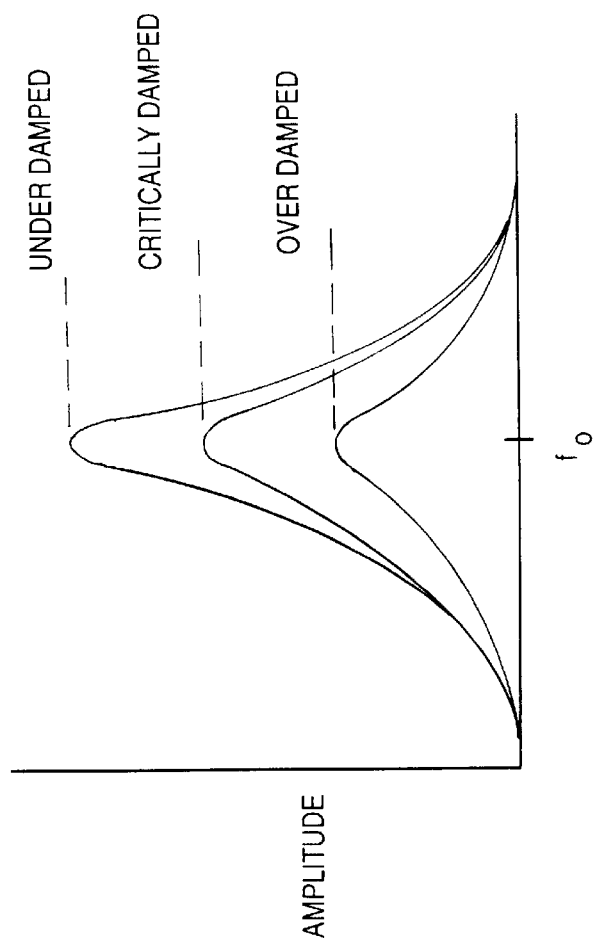
FIG. 4B is a graph of amplitude versus frequency showing the signal response of the filter of FIG. 4A.

FIG. 4A is a simplified diagram of one second order filter stage 100 of critically damped filter 28 shown in FIG. 1. FIG. 4B is a graph of amplitude versus frequency illustrating the characteristics of filter 28 in accordance with the invention. In a preferred embodiment, filter 28 comprises four such stages 100. Stage 100 includes a differential amplifier 110 having negative feedback through a resistor 102 and a capacitor 104. An input signal is received through resistor 106 and capacitor 108 and coupled to the inverting input of amplifier 110. The non-inverting input of amplifier 110 is coupled to electrical ground 78 through resistor 112.

Filter 100 forms a second order band-pass filter and is used as a single stage of critically damped filter 28 shown in FIG. 1. Critically damped filter 28 includes a total of four such stages connected in series.

Critically damped filter 28 provides a critically damped band-pass filter as illustrated in FIG. 4B. FIG. 4B also illustrates an over damped filter and an under damped filter. Preferably, filter 28 has a Q equal to 1 and a band-pass center frequency (fo) configured to be the same as the frequency of switch 22A shown in FIG. 1. If the filter is overdamped, the system will be slow to respond. If the system is underdamped, the signal will "ring". This allows substantially only components in the response signal across battery 12 which are at the same frequency as current source 22 to be passed to autorange amplifier 30. Note that additional filter stages beyond the preferred eight may be used, however, this will lead to increased manufacturing costs. In one preferred embodiment, amplifier 28 has a total gain of 16. Any type of filter can be implemented in accordance with this aspect of the present invention. The particular analog filter shown is simply one preferred embodiment. Further, a filter can also be implemented digitally.

Figure 5:
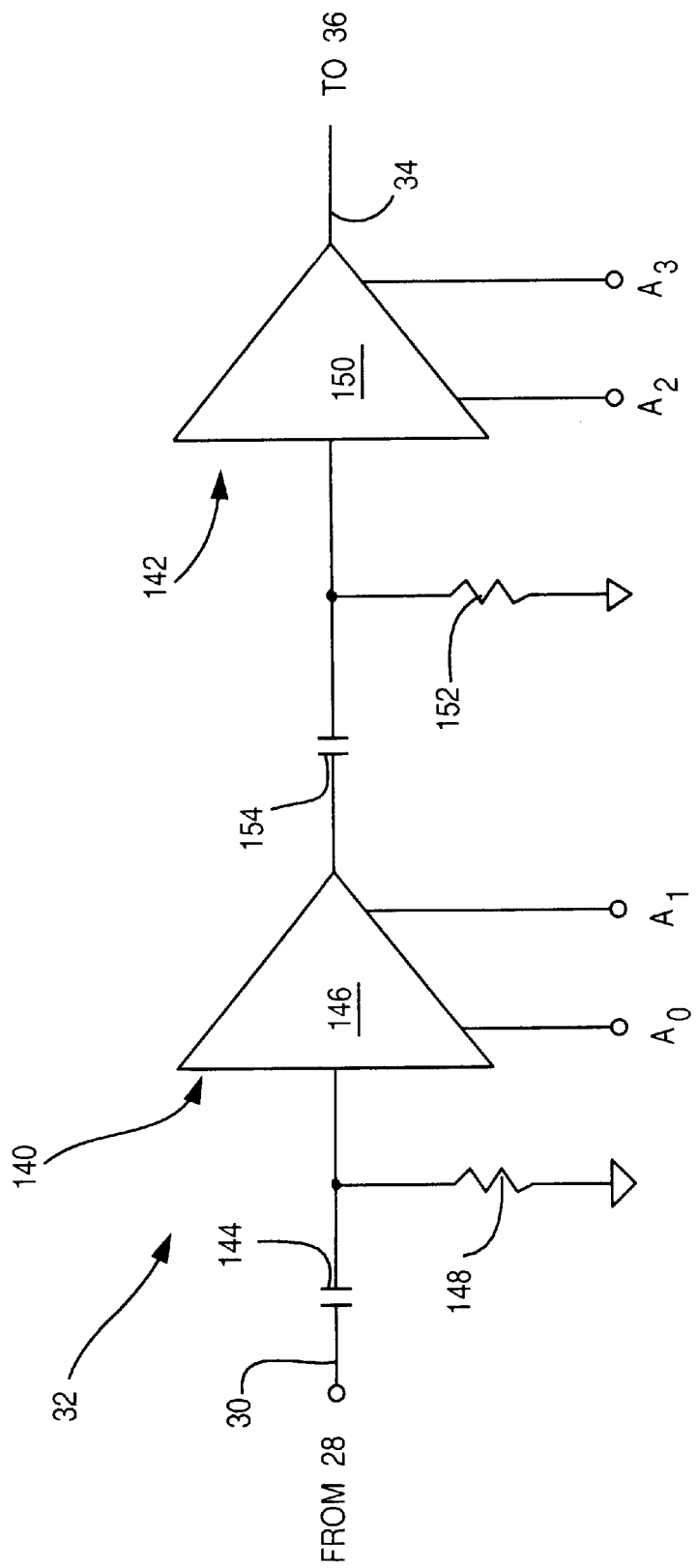
FIG. 5 is a simplified schematic diagram of an adjustable gain amplifier of FIG. 1.

FIG. 5 is a simplified diagram of auto range (programmable gain or selectable gain) amplifier 32. In the embodiment shown in FIG. 5, amplifier 32 is a two stage amplifier having a first stage 140 having selectable gains of 1, 2, 4 and 8 and a second stage amplifier 142 having selectable gains of 1, 10, 100 and 1000. Amplifier 140 is coupled to output 30 from critically damped filter 28 through coupling capacitor 144. Amplifier 140 includes selectable gain amplifier 146 and resistor 148. Amplifier 146 receives inputs $A_0$ and $A_1$ which control the amplification provided by amplifier 146. Amplifier stage 142 includes amplifier 150 having an input coupled to resistor 152 and to the output of amplifier 146 through coupling capacitor 154. The gain of amplifier 150 is controlled by control inputs $A_2$ and $A_3$. Amplifiers 146 and 150 are coupled to microprocessor 40 through control inputs $A_0$ through $A_3$. Microprocessor 40 controls the gain of amplifier 32 by selectively changing inputs $A_0$ through $A_3$ according to the following table:

TABLE 1

| $A_3$ | $A_2$ | $A_1$ | $A_0$ | GAIN | $A_3$ | $A_2$ | $A_1$ | $A_0$ | GAIN |
|---|---|---|---|---|---|---|---|---|---|
| 0 | 0 | 0 | 0 | 1 | 1 | 0 | 0 | 0 | 100 |
| 0 | 0 | 0 | 1 | 2 | 1 | 0 | 0 | 1 | 200 |
| 0 | 0 | 1 | 0 | 4 | 1 | 0 | 1 | 0 | 400 |
| 0 | 0 | 1 | 1 | 8 | 1 | 0 | 1 | 1 | 800 |
| 0 | 1 | 0 | 0 | 10 | 1 | 1 | 0 | 0 | 1000 |
| 0 | 1 | 0 | 1 | 20 | 1 | 1 | 0 | 1 | 2000 |
| 0 | 1 | 1 | 0 | 40 | 1 | 1 | 1 | 0 | 4000 |
| 0 | 1 | 1 | 1 | 80 | 1 | 1 | 1 | 1 | 8000 |

In operation, amplifier 32 provides a programmable gain of between 1 and 8000. Under the control of microprocessor 40, the gain of amplifier 32 can be adjusted such that battery test device 10 is capable of testing batteries having a wide range of resistances or conductance (i.e., between 10 mhos and 10,000 mhos). Microprocessor 40 increases the gain of amplifier 32 by controlling inputs $A_0$ through $A_3$ until a maximum signal through analog to digital convertor 36 is received. This adjustment is performed automatically and does not require intervention from an operator. This improves the ease of use of device 10 and reduces the likelihood of an incorrect measurement due to operator error. The adjustable gain amplifier 32 shown in FIG. 5 is simply one preferred embodiment of an adjustable amplifier and the present invention includes any amplifier configuration. Further, the amplifier can be placed anywhere in the signal path and does need to be located between a critically damped filter such as filter 28 and an analog to digital convertor 36.

Figure 6:
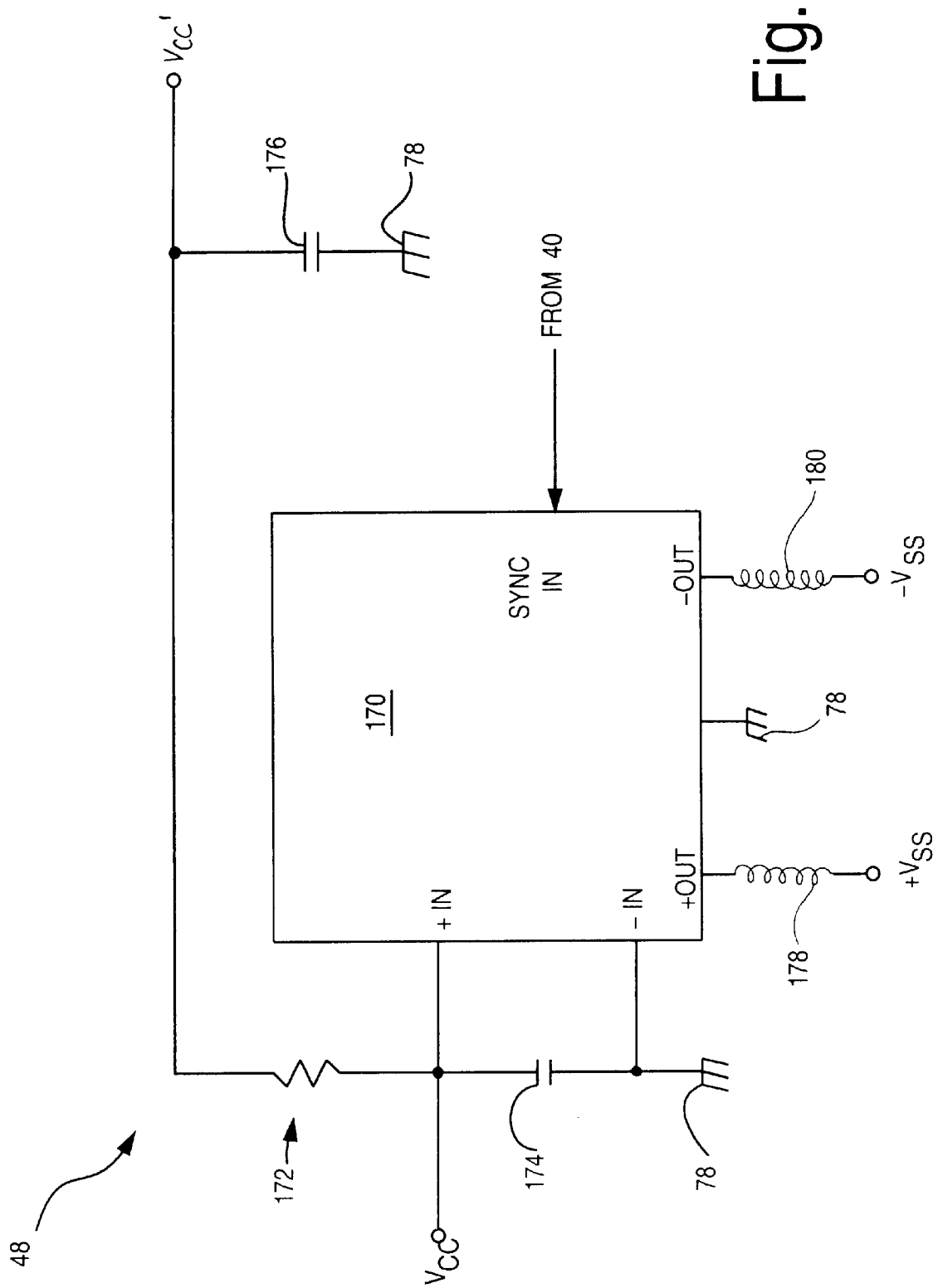
FIG. 6 is a simplified block diagram of a DC to DC convertor in accordance with another aspect of the invention.

FIG. 6 is a simplified schematic diagram of DC to DC convertor circuitry 48 in accordance with another aspect of the present invention. Circuitry 48 includes a switching type DC to DC convertor 170 which includes positive and negative inputs, positive and negative outputs and a synchronization input. FIG. 6 also shows voltages $V_{CC}$, $V'_{CC}$, $+V_{SS}$ and $-V_{SS}$. $V_{CC}$ is typically supplied by either an internal voltage source such as an internal battery or is derived from the battery under test 12 if battery 12 is sufficiently large. $V_{CC}$ is coupled to the positive input of convertor 170 and to $V'_{CC}$ through resistor 172. Capacitor 174 couples $V_{CC}$ to ground 78 and capacitor 176 couples $V'_{CC}$ to ground 78. The combination of resistor 172 and capacitor 174 and the combination of resistor 172 and capacitor 176 provide filters to signal noise on $V_{CC}$ and $V'_{CC}$. In one embodiment of the invention, $V_{CC}$ is used to drive very low noise circuitry such as amplifier 24, filter 28, amplifier 32, etc. However, $V'_{CC}$ is used to power circuitry which may create noise and is itself less susceptible to noise such as microprocessor 40 and other digital and logic circuitry. Further, the voltages $+V_{SS}$ and $-V_{SS}$ are used to power some analog components which require multiple supply voltages such as plus and minus 15 volts. Inductors 178 and 180 block noise from convertor 170 from supply voltages $+V_{SS}$ and $-V_{SS}$. In one embodiment, convertor 170 is a switching convertor with a frequency of about 400 KHz and the microprocessor 40 operates at about 4 MHz. The noise isolation provided in the embodiment of FIG. 6 reduces noise in critical components of battery test device 10 and thereby improves measurement accuracy.

Convertor 170 also includes a power reduction technique in which the synchronous in (SYNCIN) signal is provided by microprocessor 40. In some instances, analog test circuitry is not required for operation. During these time periods, microprocessor 40 can control the SYNCIN to convertor 170 such that convertor 170 is turned off and supply voltages $+V_{SS}$ and $-V_{SS}$ are not generated. This provides reduced power requirements.

Another aspect of the present invention includes improved internal (power supply) battery lifetime. The invention can be used to test batteries with an open circuit voltage as low as 1.75 volts by using internal battery. (If battery 12 is large enough, device 10 can be powered by battery 12). However, rather than requiring an expensive rechargeable battery pack, a simple replaceable battery such as a disposable 9 volt battery can be used. This is possible even though such a battery provides a relatively low capacity source of power because the present invention includes a number of circuits requiring reduced power to thereby improve battery life. These circuits include a bipolar analog power shutdown circuit 200 (FIG. 7), a high speed top-down auto-ranging circuit to minimize test time, and an automatic power down circuit for supply 48 (explained above).

In one embodiment, the amplifier 32 auto ranges over a range of 1 to 8000. When engaged, amplifier 32 consumes 10 times the internal battery power in comparison to when the amplifier is not engaged. Therefore, it is advantageous to limit the time the amplifier is on. Conductance decreases with increasing cell count due to series resistance stack-up. As a result, lower conductance measurements require less gain than higher conductance measurements.

Typically, the cell count of battery 12 will be known by microprocessor 40 because it has been input by an operator. Microprocessor 40 can then control the initial gain of amplifier 32 required for measurement. From the initial gain, the microprocessor can adjust the gain of amplifier 32 either up or down to obtain the appropriate gain for a particular battery configuration. This greatly reduces the amount of time required to obtain a measurement and therefore reduces power consumption. In one embodiment, the initial gain of amplifier stage 32 is as follows:

| NUMBER OF CELLS | INITIAL GAIN |
| --- | --- |
| 1 | 8000 |
| 2 | 4000 |
| 3 | 4000 |
| 4 | 2000 |
| 5 | 1000 |
| 6 | 800 |

Figure 7:
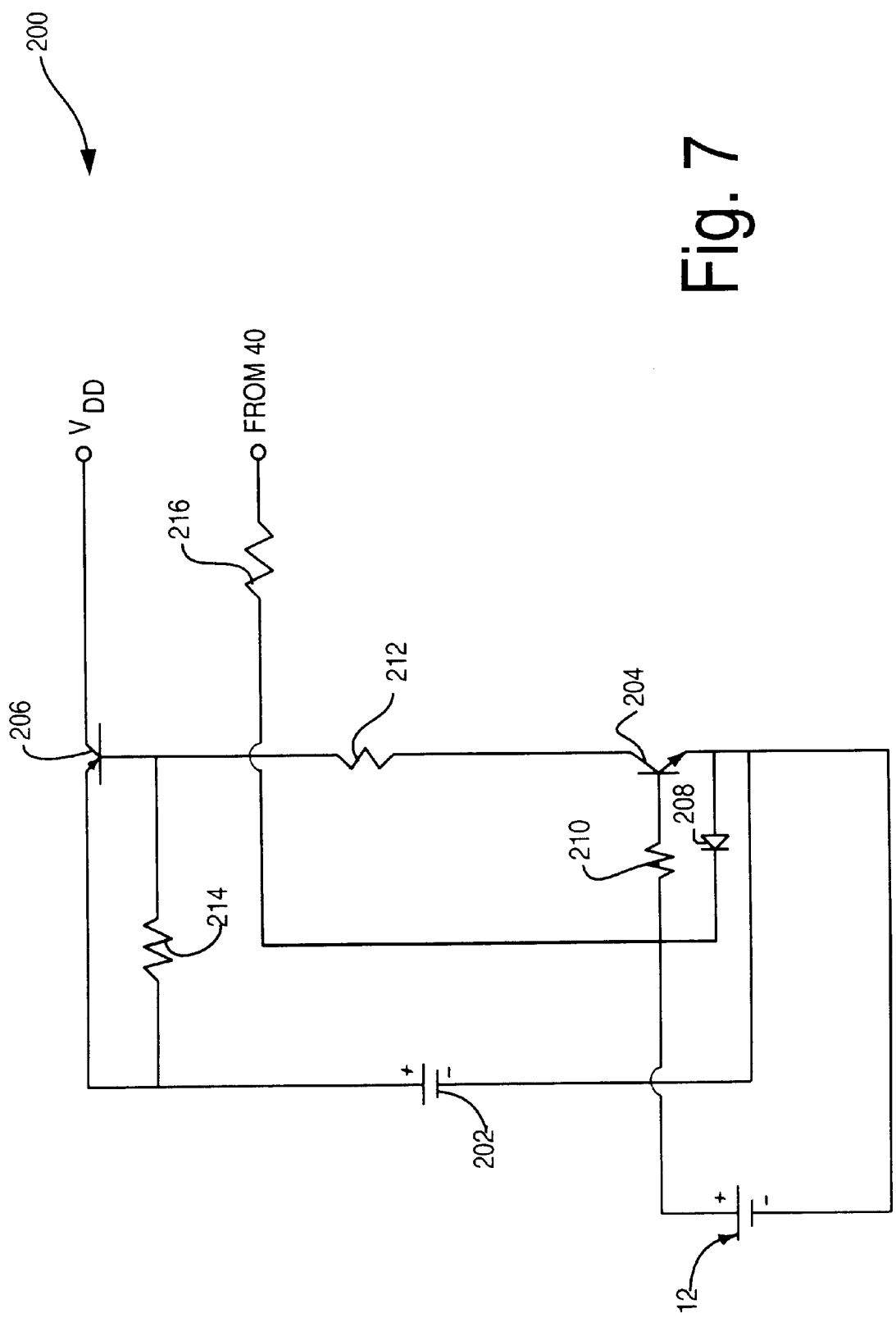
FIG. 7 is a simplified electrical schematic diagram of a shut down circuit in accordance with another aspect of the invention.

Shutdown circuit 200 is illustrated in FIG. 7 and can be used to cut off all power to analog circuitry in device 10. Circuit 200 includes internal battery 202, transistors 204 and 206, diode 208 and biasing resistors 210, 212, 214 and 216. When device 10 is coupled to battery 12, transistor 204 turns on which in turn activates transistor 206 such that a voltage $V_{DD}$ from internal battery 202 is provided at an output of circuit 200. $V_{DD}$ is then used to power analog components in device 10. However, upon removal of battery 12, transistor 206 will turn off thereby terminating supply voltage $V_{DD}$. Further, during operation, microprocessor 40 can selectively terminate supply voltage $V_{DD}$ by providing a signal through diode 208 to turn transistor 206 off. Thus, one aspect of the present invention includes disconnecting those components which are not in use from the internal power supply generating from the internal battery 202 of device 10. The various techniques for implementing this aspect of the invention are simply one preferred embodiment. Those skilled in the art will recognize that other techniques may be used to terminate power to various components or otherwise turn various components off.

Figure 8:
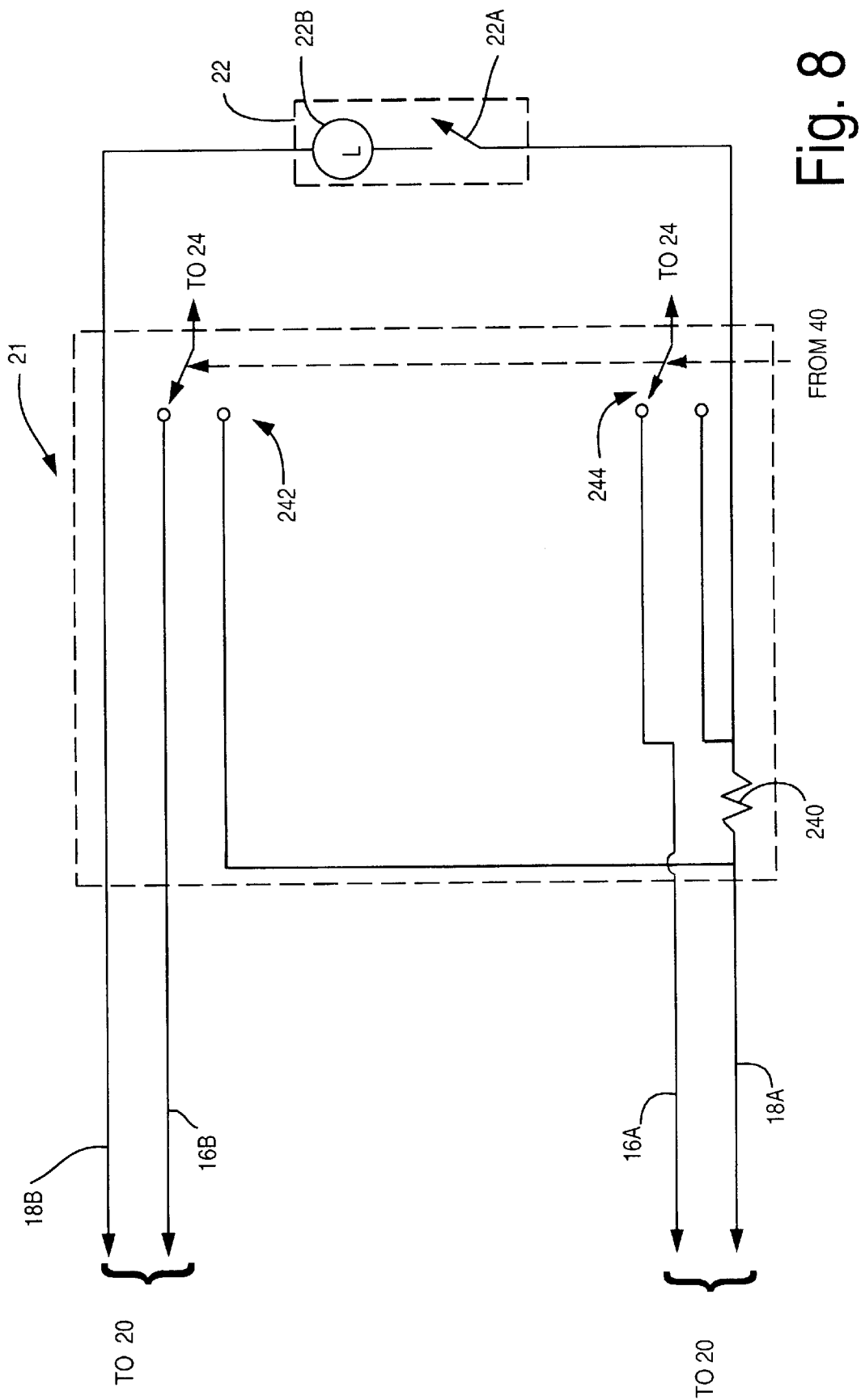
FIG. 8 is a simplified electrical schematic diagram showing a calibration circuit in accordance with another aspect of the invention.

Another aspect of the present invention is a self calibration feature using calibration circuitry 21 shown in a simplified electrical schematic diagram in FIG. 8. Circuitry 21 includes a manganin shunt conductance standard 240. Shunt 240 can be calibrated against a standard traceable to NIST. Switches 240, 242 and 244 are coupled to microprocessor 40 and are adapted to selectively switch shunt 240 in series with amplifier 24. Microprocessors can then measure the conductance of Shunts 240 using amplifier 24, filter 28, amplifier 32 and analog to digital convertor 36 and compare the measured reading with the calibrated standard stored in a memory 40A in microprocessor 40. The difference between the measured value and calibrated value can be used to introduce a correction factor and subsequent measurements to thereby maintain calibration of tester 10. The calibration can occur automatically when tester 10 is initially coupled to battery 12 or can be initiated by a user through keyboard 44.

In yet another aspect of the invention, memory 48 of microprocessor 40 contains various predefined reference standards. The appropriate reference standard for a particular battery 12 is selected by an operator through input 44. Further, an operator can recall the standard stored in memory 40A and view them through display 42. If a standard has been changed or otherwise it wished to modify to a standard, the operator can change the standards using input 44. The standard stored in memory 40A can also be printed out, for example, using input/output port 46.

Automatic temperature compensation is another feature of the present invention. A temperature sensor 250 shown in FIG. 1 can provide a temperature input to microprocessor 40. For example, sensor 250 can comprise a thermal couple, thermistor or an infrared temperature sensor directed toward battery 12. An analog to digital convertor (not shown) provides a digital representation of temperature 250 to microprocessor 40. Based upon the measured temperature, microprocessor 40 can modify the test results based upon information stored in memory 40A to thereby compensate for temperature variations.

Although the present invention has been described with reference to preferred embodiments, workers skilled in the art will recognize that changes may be made in form and detail without departing from the spirit and scope of the invention. The various functional blocks illustrated in FIG. 1 can be implemented using any appropriate technique and are not limited to those disclosed herein. Further, the various aspects of the invention can be implemented in any particular order and are not limited to the order shown in FIG. 1. The functional blocks can be implemented in either analog or digital circuitry or their hybrid. Furthermore, current source 22B can be selectively switched in using switch 22A. The invention also includes application of a voltage and measuring the resultant current response. The invention can be used with conductance, admittance, impedance or resistance based battery test circuitry. Further, some aspects of the invention may be used with any type of battery tester including load testers, simple voltage testers, testers that require the battery to be placed through a number of conditioning steps, etc.

What is claimed is:

1. An apparatus for monitoring the condition of a storage battery, comprising:

battery test circuitry adapted to couple to the storage battery through a first Kelvin connection and second Kelvin connection;

first and second electrical leads coupled to a first terminal of the battery test circuitry and adapted to provide the first Kelvin connection to the battery;

third and fourth electrical leads coupled to a second terminal of the battery test circuitry and adapted to provide the second Kelvin connection to the battery; and induction cancellation circuitry coupling the first electrical lead to the second electrical lead.

2. The apparatus of claim 1 wherein the induction cancellation circuitry provides an opposition current in the second electrical lead as a function of a current in the first electrical lead.

3. The apparatus of claim 2 wherein the current in the first electrical lead comprises an applied current and the second electrical lead provides a voltage sense connection to the battery test circuitry.

4. The apparatus of claim 3 wherein the first electrical lead carries an electrical signal having a frequency between about 5 Hz and about 500 Hz.

5. The apparatus of claim 1 wherein the induction cancellation comprises a transformer.

6. The apparatus of claim 5 wherein a first coil of the transformer is connected in series with the first electrical lead and a second coil of the transformer is connected in series with the second electrical lead.

7. The apparatus of claim 6 wherein the first and second coils are configured with opposed polarities.

8. The apparatus of claim 1 wherein the cancellation circuitry comprises means for providing an opposition current in the second electrical lead as a function of a current in the first electrical lead.

9. The apparatus of claim 1 wherein a first sense current in the first electrical lead is substantially carried in the third electrical lead as a second sense current and the induction cancellation circuit couples the second sense current to the second electrical lead.

10. The apparatus of claim 1 wherein the first electrical lead extends adjacent the second electrical lead.

11. The apparatus of claim 1 wherein the first, second, third and fourth electrical leads are removably coupled to the battery test circuitry and the inductance cancellation circuitry is carried in a housing which carries the first, second, third and fourth electrical leads whereby the induction cancellation circuitry can be adjusted during manufacture for a particular lead configuration.

12. The apparatus of claim 1 wherein the first, second, third and fourth electrical leads are of sufficient length whereby the battery test circuitry can be placed inside the vehicle and the electrical leads will reach a battery carried in an engine compartment of the vehicle.

13. A method of reducing an inductively coupled current in a Kelvin probe of an electronic battery tester, comprising:
coupling to a sense current carried on a first electrical lead of the Kelvin probe; and
supplying an opposed current in a second electrical lead of the Kelvin probe in response to the sense current, the opposed current flowing in opposition to an inductively coupled current in the second electrical lead.

14. The method of claim 13 wherein the step of coupling comprises directing the sense current through a first coil of a transformer and the step of supplying comprises connecting a second coil of the transformer in series with the second electrical lead.

15. The method of claim 14 including adjusting the response of the opposed current to the sense current to substantially cancel the inductively coupled current.

16. The method of claim 15 wherein the step of adjusting comprises adjusting the coupling between the first and second coils of the transformer.

17. An apparatus for monitoring the condition of a storage battery, comprising:
first and second Kelvin connections configured to couple to terminals of the battery;
an AC test signal source adapted to couple to the terminals of the battery through a first terminal of the first Kelvin connection and a first terminal of the second Kelvin connection and inject an AC test signal therethrough;
test circuitry adapted to provide battery condition information in response to a battery response signal; and
a DC coupled AC amplifier adapted to couple to the terminals of the battery through a second connection of the first Kelvin connection and a second connection of the second Kelvin connection and provide the battery response signal to the test circuitry as a function of an AC response signal arising in response to the AC test signal between the battery terminals, the battery response signal substantially independent of DC battery voltage.

18. The apparatus of claim 17 wherein the DC coupled AC amplifier includes a differential amplifier having a DC error signal feedback path between an output of the amplifier and an input of the amplifier.

19. The apparatus of claim 18 wherein the input comprises a non-inverting input of the amplifier.

20. The apparatus of claim 19 including an inverting amplifier in the feedback path.

21. The apparatus of claim 18 including an integrating circuit in the feedback path.

22. The apparatus of claim 17 including a critically damped band-pass filter coupling an output of the differential amplifier to the test circuitry.

23. The apparatus of claim 22 wherein the band-pass filter is adapted to pass frequencies in a frequency range proximate a frequency of the AC test signal.

24. The apparatus of claim 22 wherein the band-pass filter comprises an 8th order filter.

25. The apparatus of claim 17 including a power supply comprising a DC to DC convertor to provide power to analog circuitry.

26. The apparatus of claim 17 wherein the test circuitry includes a memory containing battery test criteria and the battery test criteria can be edited by an operator.

27. The apparatus of claim 17 including a temperature sensing element and the test circuitry performing compensation as a function of the temperature to detect battery temperature.

28. The apparatus of claim 27 wherein the temperature sensing element is directed toward a post of the battery.

29. The apparatus of claim 17 including an adjustable gain stage adapted to amplify the AC response signal.

30. The apparatus of claim 29 wherein amplification of the adjustable gain stage is controlled as a function of conductance of the storage battery.

31. The apparatus of claim 17 including an automatic shutdown circuit to reduce power consumption of the test circuitry.

32. The apparatus of claim 17 including a reference standard and wherein the test circuitry performs a self calibration by selectively applying the AC test signal to the calibrated standard and monitoring a response signal.

33. The apparatus of claim 25 including filtering circuitry to reduce noise coupling into noise sensitive components of the apparatus of the test circuitry.

34. An apparatus for monitoring the condition of a storage battery, comprising:
an AC test signal source adapted to couple to terminals of the battery and inject an AC test signal therethrough;
test circuitry adapted to provide battery condition information in response to a battery response signal; and
a critically damped band-pass filter adapted to couple to the terminals of the battery and provide the battery response signal to the test circuitry as a function of an AC response signal arising in response to the AC test signal between the battery terminals, the battery response signal substantially independent of DC battery voltage.

35. The apparatus of claim 34 wherein the critically damped band-pass filter is adapted to pass frequencies in a frequency range proximate a frequency of the AC test signal.

36. The apparatus of claim 34 wherein the critically damped band-pass filter comprises an 8th order filter.

37. The apparatus of claim 34 including a temperature sensing element and the test circuitry performing compensation as a function of the temperature to detect battery temperature.

38. The apparatus of claim 37 wherein the temperature sensing element is directed toward a post of the battery.

39. An apparatus for monitoring the condition of a storage battery, comprising:

first and second Kelvin connections configured to couple to terminals of the battery;

an AC test signal source adapted to couple to the terminals of the battery through a first terminal of the first Kelvin connection and a first terminal of the second Kelvin connection and inject an AC test signal therethrough;

test circuitry adapted to provide battery condition information in response to a battery response signal; and an adjustable gain stage adapted to couple to the terminals of the battery through a second connection of the first Kelvin connection and a second connection of the second Kelvin connection and provide the battery response signal to the test circuitry as a function of an AC response signal arising in response to the AC test signal between the battery terminals, the adjustable gain stage having a gain input and wherein the amplification gain of the adjustable gain stage is a function of the gain input.

40. The apparatus of claim 39 wherein amplification gain of the adjustable gain stage is controlled as a function of conductance of the storage battery.

41. The apparatus of claim 40 including a microprocessor to automatically control the gain of the adjustable gain stage.

42. The apparatus of claim 39 including an automatic shutdown circuit to reduce power consumption of the test circuitry.

* * * * *